United States Patent
Yoshida et al.

(10) Patent No.: US 11,527,536 B2
(45) Date of Patent: Dec. 13, 2022

(54) SEMICONDUCTOR STRUCTURE WITH GATE ELECTRODE DOPING

(71) Applicant: Micron Technology, Inc., Boise, ID (US)

(72) Inventors: Mika Yoshida, Hiroshima (JP); Yoshikazu Moriwaki, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 66 days.

(21) Appl. No.: 17/143,923

(22) Filed: Jan. 7, 2021

(65) Prior Publication Data
US 2022/0216206 A1 Jul. 7, 2022

(51) Int. Cl.
*H01L 27/092* (2006.01)
*H01L 29/78* (2006.01)
*H01L 29/49* (2006.01)

(52) U.S. Cl.
CPC ...... *H01L 27/0922* (2013.01); *H01L 29/4966* (2013.01); *H01L 29/7833* (2013.01)

(58) Field of Classification Search
CPC ............. H01L 27/0922; H01L 29/4966; H01L 29/7833
See application file for complete search history.

(56) References Cited

U.S. PATENT DOCUMENTS

| | | | | |
|---|---|---|---|---|
| 10,249,488 B1* | 4/2019 | Hsu | ...................... | H01L 29/7833 |
| 2013/0328133 A1* | 12/2013 | Song | ............... | H01L 21/823412 |
| | | | | 257/392 |
| 2014/0048876 A1* | 2/2014 | Sekiguchi | ......... | H01L 21/82385 |
| | | | | 257/338 |

\* cited by examiner

*Primary Examiner* — Karen Kusumakar
*Assistant Examiner* — Adam S Bowen
(74) *Attorney, Agent, or Firm* — Dorsey & Whitney LLP

(57) ABSTRACT

Semiconductor devices including structures of gate electrode layers are disclosed. An example semiconductor device according to the disclosure includes a semiconductor substrate and first and second gate electrodes above the semiconductor substrate. Each gate electrode of the first and second gate electrodes includes a gate insulator above the semiconductor substrate, a first gate electrode layer on the gate insulator, and a second gate electrode layer on the first gate electrode layer. The second gate electrode layers of the first and second gate electrodes have impurity concentrations that are different from one another.

20 Claims, 5 Drawing Sheets

| P Concentration in Poly-Si of Gate (GP) | High | Low |
|---|---|---|
| Transistor A | High Vt | |
| Transistor B | | Low Vt |

FIG. 1B

|  | GP (High) | GP (Low) |
|---|---|---|
| Transistor A (Channel/LDD Low Dose) | Vt1 | Vt2 |
| Transistor B (Channel/LDD Middle Dose) | Vt3 | Vt4 |
| Transistor C (Channel/LDD High Dose) | Vt5 | Vt6 |

US 11,527,536 B2

SEMICONDUCTOR STRUCTURE WITH GATE ELECTRODE DOPING

BACKGROUND

Recently, in semiconductor memory devices such as dynamic random access memory (hereinafter referred to as DRAM), a structure of metal inserted poly-silicon (MIPS) has been adopted as the structure of transistors in memory cells. In assessing the performance of a metal-oxide-semiconductor field-effect transistor (MOSFET) in a semiconductor device, a threshold voltage (Vt) of the MOSFET is a reliable parameter. The threshold voltage (Vt) is a gate voltage applied between a gate and a source of the MOSFET needed to cause drain current to flow, that is, to turn on the MOSFET.

A threshold voltage (Vt) of a MOSFETs having the M IPS structure has been controlled by several methods. One method is adjusting a gate work function of a metal electrode of the MOSFET. A gate work function of a gate electrode made of titanium nitride (TiN) film can be adjusted by adjusting a ratio of titanium (Ti) and nitrogen (N) in the TiN film. By increasing the ratio of titanium (Ti), an electrode with a lower work function can be obtained, and it is used as a gate electrode for an N-type channel MOSFET transistor (NMOS transistor).

Another method of adjusting the threshold voltage of a MOSFET is performing dopant implantation to adjust a concentration of a dopant of a channel side of the MOSFET. In order to obtain NMOS transistors having different threshold voltages and the same gate insulator thickness and on the same wafer, dopant implantation to channel regions or lightly doped drain regions (LDD) below the gate insulators may be performed to give different dopant concentrations of the channel side of the NMOS transistors. The NMOS transistors may have different dopant profiles, using different channel implant masks and/or LDD implant masks. Using this method, the NMOS transistors of different threshold voltages may have the identical vertical structures on or above the gate insulators. However, undesirable short-channel effects arise by performing channel counter-doping. Furthermore, this channel side dopant implantation increases manufacturing costs because it is an additional implant step and requires additional masking steps.

BRIEF DESCRIPTION OF THE DRAWINGS

FIG. 1B is a table indicating a relationship between phosphorus concentrations in poly-silicon (poly-Si) layers of gate electrodes of the plurality of transistors and gate threshold voltages of the plurality of transistors, in accordance with an embodiment of the present disclosure.

DETAILED DESCRIPTION OF PREFERRED EMBODIMENTS

Various embodiments of the present disclosure will be explained below in detail with reference to the accompanying drawings. The following detailed description refers to the accompanying drawings that show, by way of illustration, specific aspects in which embodiments of the present disclosure may be practiced. These embodiments are described in sufficient detail to enable those skilled in the art to practice the embodiments of present disclosure. Other embodiments may be utilized, and structure, logical and electrical changes may be made without departing from the scope of the present disclosure. The various embodiments disclosed herein are not necessary mutually exclusive, as some disclosed embodiments can be combined with one or mom other disclosed embodiments to form new embodiments.

Embodiments of the present disclosure will be described with reference to FIG. 1A to FIG. 3C. The following description uses a DRAM as an illustrative example of a semiconductor device.

Figure 1A:
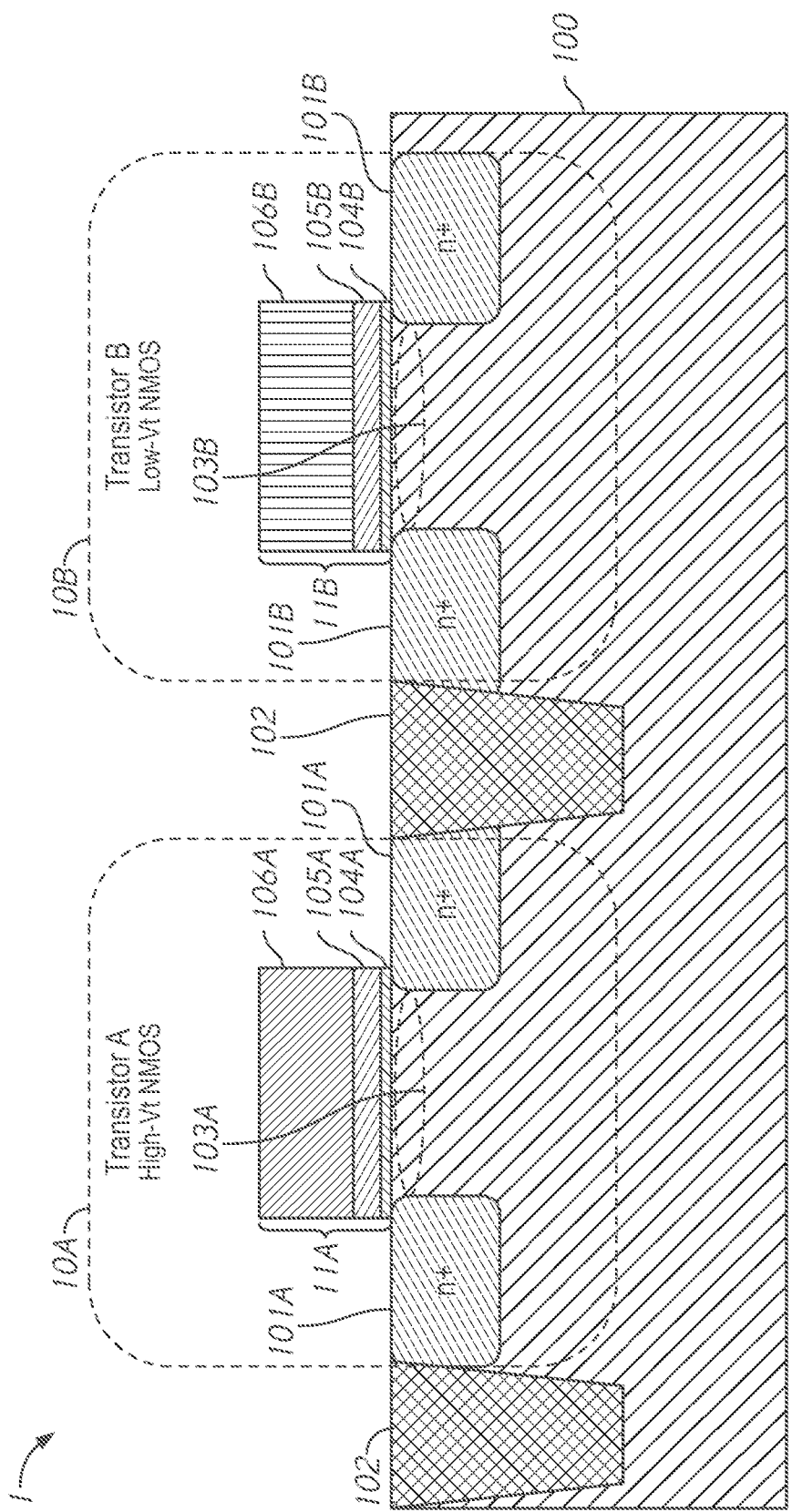
FIG. 1A is a schematic diagram illustrating a vertical cross-sectional view of a schematic structure of a semiconductor device including a plurality of transistors according to the embodiment of the present disclosure.

FIG. 1A is a schematic diagram illustrating a vertical cross-sectional view of a schematic structure of a semiconductor device 1 including a plurality of transistors 10A and 10B according to the embodiment of the present disclosure. The semiconductor device 1 includes a semiconductor substrate 100. The semiconductor substrate 100 may be a silicon wafer including, for example, monocrystalline silicon. The semiconductor device 1 includes an isolation region 102 on the semiconductor substrate 100. The isolation region 102 may include, for example, a shallow trench isolation (STI) structure. The isolation region 102 may be formed by etching trenches in the semiconductor substrate 100 and depositing an insulating film such as a silicon dioxide ($SiO_2$) film and a silicon nitride (SiN) film to fill the trenches. The transistors 10A and 10B are formed on active regions defined by the isolation region 102. The isolation region 102 functions to electrically isolate elements of transistors 10A and 10B formed on the semiconductor substrate 100 from each other.

The transistors 10A includes a gate electrode 11A that is above the semiconductor substrate 100 and a channel region 103A below the gate electrode 11A. The transistor 10A also includes source/drain regions 101A at opposite ends of the channel region 103A. The transistors 10B includes a gate electrode 11B above the semiconductor substrate 100 and a channel region 103B below the gate electrode 11B. The transistors 10B also includes source/drain regions 101B at opposite ends of the channel region 103B. In some embodiments of FIG. 1A, the source/drain regions 101A and 101B may be n-type regions. However, the source/drain regions of p-type regions or a mixture of p-type and n-type regions may also be applicable. In FIG. 1A, the transistors 10A and 10B are N-channel MOSFETs. The gate electrodes 11A and 11B serve as gate electrodes of the transistors 10A and 10B, respectively.

The gate electrode 11A includes a gate insulator 104A above the semiconductor substrate 100, a first electrode layer 105A on the gate insulator 104A and a second gate electrode layer 106A on the first electrode layer 105A. The gate electrode 11B of the transistor 10B includes a gate insulator 104B above the semiconductor substrate 100, a first gate electrode layer 105B on the gate insulator 104B and a second gate electrode layer 106B on the first gate electrode layer 105B.

In some embodiments, the gate insulators 104A and 104B may be formed as one insulating layer. The gate insulators 104A and 104B may include a High-k material with a high relative permittivity. The High-k film may include, for example, an oxidized material containing a transition metal and the like. The High-k film may include an oxidized material containing any one of, for example, yttrium (Y), titanium (Ti), zirconium (Zr), hafnium (Hf), niobium (Nb), tantalum (Ta), and aluminum (Al). The gate insulators 104A and 104B may further include other elements such as silicon and nitrogen.

In some embodiments, the first gate electrode layers 105A and 105B are metal layers. The first gate electrode layers included in the gate electrodes 11A and 11B may include, for example, titanium nitride (TiN). In some embodiments, the first gate electrode layers 105A and 105B may be formed as one first gate electrode layer having a constant composition ratio between titanium (Ti) and nitrogen (N). Work functions of the first gate electrode layers 105A and 105B may be set to be suitable for the N-channel MOSFETs. The second gate electrode layers 106A and 106B may be poly-silicon (poly-Si) layers including poly-silicon. The second gate electrode layers 106A and 106B may be doped with an impurity, for example, phosphorus (P), arsenic (As) or boron (B). In some embodiments, the impurity may be an N-type impurity such as phosphorus (P) or arsenic (As). In some embodiments, the impurity may be a P-type impurity such as Boron (B).

A higher impurity concentration in a second gate electrode layer (a poly-Si layer) of a gate electrode may increase a work function of an adjacent first gate electrode layer of the gate electrode. The increase of the work function of the first gate electrode layer of the gate electrode results in a higher threshold voltage of a transistor including the gate electrode. A lower impurity concentration in a second gate electrode layer (a poly-Si layer) of a gate electrode may decrease a work function of an adjacent first gate electrode layer of the gate electrode. The decrease in the work function of the first gate electrode layer of the gate electrode results in a lower threshold voltage of a transistor including the gate electrode. The second gate electrode layers 106A and 106B in FIG. 1A may have different impurity concentrations in some embodiments of the disclosure. FIG. 1B is a table indicating a relationship between phosphorus concentrations in second gate electrode layers (poly-Si layers) 106A and 106B of gate electrodes 11A and 11B of the plurality of transistors 10A and 10B and gate threshold voltages (Vt) of the plurality of transistors 10A and 10B, in accordance with an embodiment of the present disclosure. The transistor 10A (Transistor A) with a relatively higher impurity concentration in the gate electrode (poly-Si) layer 106A has a relatively higher threshold voltage (High Vt). On the other hand, the transistor 10B (Transistor B) with a relatively lower impurity concentration in the gate electrode (poly-Si) layer 106B, compared to the impurity concentration in the gate electrode (poly-Si) layer 106A, has a relatively lower threshold voltage (Low Vt) compared to the threshold voltage of the transistor 10A.

The second gate electrode layers 106A and 106B may be formed, at least in part, in different steps. For example, a poly-Si layer deposition with high doping of phosphorus can be performed to form a high impurity concentration film in the semiconductor device 1. The high impurity concentration film may include the second gate electrode layer 106A. Another poly-Si layer deposition with low doping of phosphorus can be performed to form a low impurity concentration film in the semiconductor device 1. The low impurity concentration film may include the second gate electrode layer 106B. Thus, these two poly-Si layer depositions of different levels of impurity doping performed as separate steps may provide two different impurity concentration films, one film for the second gate electrode layer 106A and another film for the second gate electrode layer 106B. Alternatively, the second gate electrode layers 106A and 106B may be formed in a same process step by a poly-Si layer deposition followed by separate doping processes. In some embodiments, the doping processes may be performed by ion implantation. In some embodiments, the doping processes may be performed by plasma doping. The impurity, such as phosphorus, may be doped to provide different impurity concentrations as post-deposition steps. Thus, the second gate electrode layers 106A and 106B may have different impurity concentrations and substantially the same thickness. Because of the same thickness of the second gate electrode layers 106A and 106B, the same post-deposition processes may be performed for the gate electrodes 11A and 11B. Such post-deposition processes may include, for example, gate etching. Thus, doping impurity to cause different impurity concentrations in the second gate electrode layers 106A and 106B can reduce the number of process steps as compared to the case of forming the second gate electrode layers 106A and 106B independently in different process steps. The lower-cost semiconductor device 1 and the manufacturing method thereof can therefore be provided.

Even if the composition ratios of titanium (Ti) and nitrogen (N) are the same across the first gate electrode layers 105A and 105B, the work function of the first gate electrode layer 105A included in the gate electrode 11A and the work function of the first gate electrode layer 105B included in the gate electrode 11B may be different due to the different impurity concentrations of the second gate electrode layers 106A and 106B. Because of the different work functions of the first gate electrode layers 105A and 105B, the threshold voltages of the N-channel MOSFETs 10A and 10B are different. Thus, without doping channel sides of the transistors 10A and 10B, the threshold voltages of the transistors 10A and 10B can be adjusted differently by the different impurity concentrations of the second gate electrode layers 106A and 106B.

Figure 2:
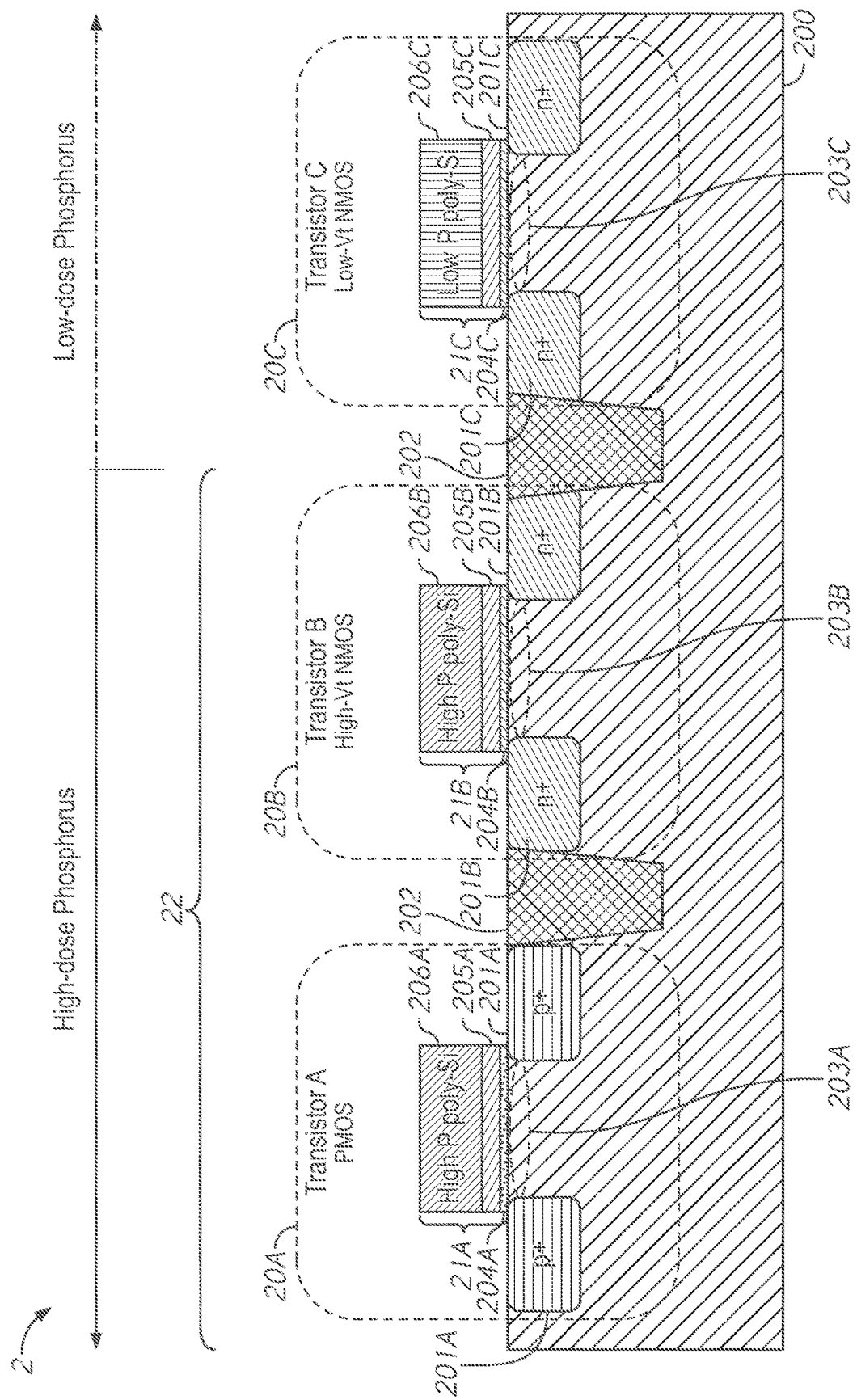
FIG. 2 is a schematic diagram illustrating a vertical cross-sectional view of a schematic structure of a semiconductor device including a plurality of transistors according to the embodiment of the present disclosure.

FIG. 2 is a schematic diagram illustrating a vertical cross-sectional view of a schematic structure of a semiconductor device 2 including a plurality of transistors 20A, 20B and 20C according to the embodiment of the present disclosure. The semiconductor device 2 includes a semiconductor substrate 200 and an isolation region 202 on the semiconductor substrate 200 similarly to the semiconductor device 1. Thus, detailed description of the semiconductor substrate 200 and the isolation region 202 is omitted in the interest of brevity.

The transistors 20A, 20B and 20C are formed on active regions defined by the isolation region 202 and the transistors 20A, 20B and 20C are electrically isolated from each other by the isolation region 202. The transistors 20A includes a gate electrode 21A above the semiconductor substrate 200 and a channel region 203A below the gate electrode 21A. The transistor 20A also includes source/drain regions 201A at opposite ends of the channel region 203A. The transistors 20B includes a gate electrode 21B above the semiconductor substrate 200 and a channel region 203B below the gate electrode 21B. The transistors 20B also includes source/drain regions 201B across the channel region 203B. The transistors 20C includes a gate electrode 21C above the semiconductor substrate 200 and a channel region 203C below the gate electrode 21C. The transistors 20C also includes source/drain regions 201C at opposite ends of the channel region 203C. In some embodiments of FIG. 2, the source/drain region 201A may be a p-type region and the source/drain regions 201B and 201C may be n-type regions. However, the source/drain regions of p-type regions or a mixture of p-type and n-type regions may also be applicable. In FIG. 2, the transistor 20A is a P-channel MOSFET and the transistors 20B and 20C are N-channel MOSFETs. In some embodiments, the semiconductor device 2 may include a complementary metal oxide semiconductor (hereinafter referred to as "CMOS") circuit 22. The CMOS circuit 22 includes the transistors 20A and 20B. The gate electrodes 21A, 21B and 21C serve as gate electrodes of the transistors 20A, 20B and 20C, respectively.

The gate electrode 21A includes a gate insulator 204A above the semiconductor substrate 200, a first gate electrode layer 205A on the gate insulator 204A and a second gate electrode layer 206A on the first gate electrode layer 205A. The gate electrode 21B of the transistor 20B includes a gate insulator 204B above the semiconductor substrate 200, a first gate electrode layer 205B on the gate insulator 204B and a second gate electrode layer 206B on the first gate electrode layer 205B. The gate electrode 21C of the transistor 20C includes a gate insulator 204C above the semiconductor substrate 200, a first gate electrode layer 205C on the gate insulator 204C and a second gate electrode layer 206C on the first gate electrode layer 205C.

In some embodiments, the gate insulators 204A, 204B and 204C may be formed as one insulating layer. The gate insulators 204A, 204B and 204C may include a High-k material with a high relative permittivity. A detailed description of composition of the gate insulators 204A, 204B and 204C is omitted in the interest of brevity.

In some embodiments, the first gate electrode layers 205A, 205B and 205C included in the gate electrodes 21A, 21B and 21C may include, for example, titanium nitride (TiN). In some embodiments, as shown in FIG. 2, the first gate electrode layers 205B and 205C may be formed as one first gate electrode layer having a constant composition ratio between titanium (Ti) and nitrogen (N). In some embodiments, the first gate electrode layer 205A may be formed as another first gate electrode layer having another composition (e.g., a different chemical composition) including another type of metal material. For example, the first gate electrode layer 205A may have a composition including titanium (Ti), nitrogen (N) and aluminum (Al). In some embodiments, the first gate electrode layer 205A may have another composition ratio between titanium (Ti) and nitrogen (N), different from the same composition ratio of the first gate electrode layers 205B and 205C. A work function of the first gate electrode layer 205A may be set to be suitable for the P-channel MOSFET and work functions of the first gate electrode layers 205B and 205C may be set to be suitable for the N-channel MOSFETs. The second gate electrode layers 206A, 206B and 206C may be poly-silicon (poly-Si) layers including poly-silicon. The second gate electrode layers 206A, 206B and 206C may be doped with an impurity, for example, phosphorus (P), arsenic (As) or boron (B). In some embodiments, the impurity may be an N-type impurity such as phosphorus (P) or arsenic (As). In some embodiments, the impurity may be a P-type impurity such as Boron (B).

A relatively higher impurity concentration in a second gate electrode layer (a poly-Si layer) of a gate electrode may increase a work function of an adjacent first gate electrode layer of the gate electrode. The increase of the work function of the first gate electrode layer of the gate electrode results in a higher threshold voltage of a transistor including the gate electrode. A relatively lower impurity concentration in a second gate electrode layer (a poly-Si layer) of a gate electrode may decrease a work function of an adjacent first gate electrode layer of a transistor including the gate electrode. The decrease in the work function of the first gate electrode layer of the gate electrode results in a lower threshold voltage of the gate electrode. In some embodiments of the disclosure, the second gate electrode layers 206A and 206B may have the same impurity concentration and the second gate electrode layer 206C may have a different impurity concentration from the impurity concentration of the second gate electrode layers 206A and 206B. For example, the transistor 20A (Transistor A) may have a gate electrode (poly-Si) layer 206A with relatively high impurity concentration and the transistor 20B (Transistor B) may also have a gate electrode (poly-Si) layer 206B with relatively high impurity concentration. Increasing the impurity concentration of the gate electrode (poly-Si) layer 206A causes the threshold voltage Vt of the transistor 20A to increase (e.g., a greater Vgs needed to activate the transistor 20A). As a result, the transistor 20A may have a relatively higher Vt (High Vt) compared to a transistor having a gate electrode (poly-Si) layer 206A with a lower impurity concentration. Likewise, increasing the impurity concentration of the gate electrode (poly-Si) layer 206B causes the threshold voltage Vt of the transistor 20B to increase (e.g., a greater Vgs needed to activate the transistor 20B). As a result, the transistor 20B may also have a relatively higher Vt (High Vt) compared to a transistor having a gate electrode (poly-Si) layer 206B with a lower impurity concentration. The transistor 20C (Transistor C) may have a gate electrode (poly-Si) layer 206A with relatively low impurity concentration. Decreasing the impurity concentration of the gate electrode (poly-Si) layer 206C causes the threshold voltage Vt of the transistor 20C to decrease (e.g., a lesser Vgs needed to activate the transistor 20C). As a result, the transistor 20C may have a relatively lower Vt (Low Vt) compared to a transistor having a gate electrode (poly-Si) layer 206C with a higher impurity concentration (e.g., compared to transistor 203).

In some embodiments, the second gate electrode layers 206A, 206B and 206C may be formed, at least in part, in different steps using separate masks. For example, a poly-Si layer deposition with high doping of phosphorus can be performed to form the second gate electrode layers 206A and 206B while masking an area surrounding the second gate electrode layers 206A and 206B. Another poly-Si layer deposition with low doping of phosphorus can be performed to form the second gate electrode layer 206C outside the masked area. Thus, these two poly-Si layer depositions of different levels of impurity doping may be performed as separately. In some embodiments, the second gate electrode layers 206A, 206B and 206C may be formed in a same process by a poly-Si layer deposition followed by separate doping processes. The impurity, such as phosphorus, may be doped to provide different impurity concentrations as post-deposition steps. Thus, the second gate electrode layer 206C may have the different impurity concentration from the impurity concentration of the second gate electrode layers 206A and 206B, while the second gate electrode layers 206A, 206B and 206C may have substantially the same thickness. Because of the same thickness of the second gate electrode layers 206A, 206B and 206C, the same post-deposition processes may be performed for the gate electrodes 21A, 21B and 21C. Such post-deposition processes may include, for example, gate etching. Thus, doping impurity to cause different impurity concentrations in the second gate electrode layers 206A, 206B and 206C can reduce the number of process steps as compared to the case of forming the second gate electrode layers 206A, 206B and 206C independently in different process steps. The lower-cost semiconductor device 2 and the manufacturing method thereof can therefore be provided.

Even if the composition ratio between titanium (Ti) and nitrogen (N) is constant across the first gate electrode layers 205A, 205B and 205C, the work functions of the first gate electrode layers 205A and 205B included in the gate electrodes 21A and 21B respectively and the work function of the first gate electrode layer 205C included in the gate electrode 21C may be different because of the high impurity concentration of the second gate electrode layers 206A and 206B and the low impurity concentration of the second gate electrode layer 206C. Because of the different work functions of the first gate electrode layers 205B and 205C, the transistors 20B and 20C may have the different threshold voltages. Thus, without doping channel sides of the transistors 20B and 20C differently, the threshold voltage of the transistor 20B in the CMOS circuit 22 and the threshold voltage of the transistor 20C may be adjusted differently from each other by the different impurity concentrations of the second gate electrode layers 206B and 206C.

Figure 3A:
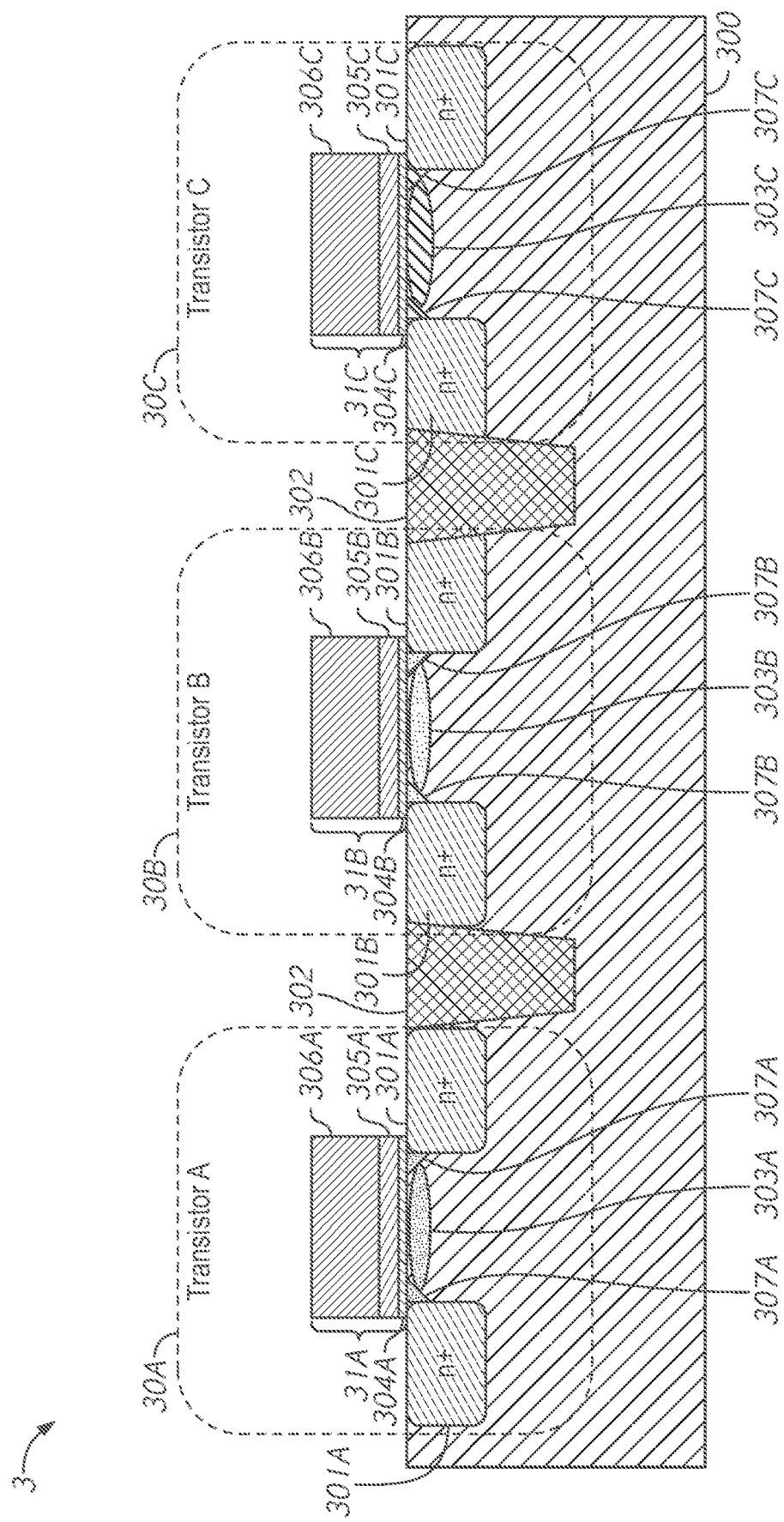
FIG. 3A is a schematic diagram illustrating a vertical cross-sectional view of a schematic structure of a semiconductor device including a plurality of transistors according to the embodiment of the present disclosure.

FIG. 3A is a schematic diagram illustrating a vertical cross-sectional view of a schematic structure of a semiconductor device 3 including a plurality of transistors 30A, 30B and 30C according to the embodiment of the present disclosure. The semiconductor device 3 includes a semiconductor substrate 300 and an isolation region 302 on the semiconductor substrate 3M) similarly to the semiconductor device 1. Thus, detailed description of the semiconductor substrate 300 and the isolation region 302 is omitted in the interest of brevity.

The transistors 30A, 30B and 30C may be formed on active regions defined by the isolation region 302 and the transistors 30A, 30B and 30C are electrically isolated from each other by the isolation region 302. The transistors 30A includes a gate electrode 31A above the semiconductor substrate 300 and a channel region 303A below the gate electrode 31A. The transistor 30A also includes source/drain regions 301A at opposite ends of the channel region 303A. The transistor 30A may also include a lightly doped drain (LDD) 307A that extends to the side of the channel region 303A adjacent to the source/drain regions 301A. The transistors 30B includes a gate electrode 31B above the semiconductor substrate 300 and a channel region 303B below the gate electrode 31B. The transistor 30B also includes source/drain regions 301B at opposite ends of the channel region 303B. The transistor 30B may also include a lightly doped drain (LDD) 307B that extends to the side of the channel region 303B adjacent to the source/drain regions 301B. The transistors 30C includes a gate electrode 31C above the semiconductor substrate 300 and a channel region 303C below the gate electrode 31C. The transistor 30C also includes source/drain regions 301C at opposite ends of the channel region 303C. The transistor 30C may also include a lightly doped drain (LDD) 307C that extends to the side of the channel region 303C adjacent to the source/drain regions 301C.

In some embodiments of FIG. 3A, the source/drain regions 301A, 301B and 301C may be n-type regions. However, the source/drain regions of p-type regions or a mixture of p-type and n-type regions may also be applicable. In FIG. 3A, the transistors 30A, 30B and 30C are N-channel MOSFETs. The gate electrodes 31A, 31B and 31C serve as gate electrodes of the transistors 30A, 30B and 30C, respectively. The gate electrode 31A includes a gate insulator 304A on the channel region 303A, a first gate electrode layer 305A on the gate insulator 304A and a second gate electrode layer 306A on the first gate electrode layer 305A. The gate electrode 31B of the transistor 30B includes a gate insulator 304B on the channel region 303B, a first gate electrode layer 305B on the gate insulator 304B and a second gate electrode layer 306B on the first gate electrode layer 305B. The gate electrode 31C of the transistor 30C includes a gate insulator 304C on the channel region 303C, a first gate electrode layer 305C on the gate insulator 304C and a second gate electrode layer 306C on the channel region 303C.

In some embodiments, the gate insulators 304A, 304B and 304C may be formed as one insulating layer. The gate insulators 304A, 304B and 304C may include a High-k material with a high relative permittivity. A detailed description of composition of the gate insulators 304A, 304B and 304C is omitted in the interest of brevity.

In some embodiments, the first gate electrode layers 305A, 305B and 305C included in the gate electrodes 31A, 31B and 31C may include, for example, titanium nitride (TiN). In some embodiments, as shown in FIG. 3A, the first gate electrode layers 305A, 305B and 305C may be formed as one first gate electrode layer having a constant composition ratio between titanium (Ti) and nitrogen (N). Work functions of the first gate electrode layers 305A, 305B and 305C may be set to be suitable for the N-channel MOSFETs. The second gate electrode layers 306A, 306B and 306C may be poly-silicon (poly-Si) layers including poly-silicon. The second gate electrode layers 306A, 306B and 306C may be doped with an impurity, for example, phosphorus (P), arsenic (As) or boron (B). In some embodiments, the impurity may be an N-type impurity such as phosphorus (P) or arsenic (As). In some embodiments, the impurity may be a P-type impurity such as Boron (B).

To control a gate threshold voltage of each transistor, a combination of adjusting dopant concentration of a channel side of each transistor and adjusting impurity concentration in a gate electrode of each transistor may be performed. Adjusting impurity concentration of the channel side of each transistor may be performed by doping impurity in a channel region or a LDD of each transistor.

In some embodiments, the gate threshold voltage may be controlled by adjusting a dopant concentration of a channel side of each transistor. In some embodiments, the channel regions 303A, 303B and 303C may be doped with an impurity. In some embodiments, the LDDs 307A, 307B and 307C may be doped with an impurity. In some embodiments, the channel regions 303A, 303B and 303C and the LDDs 307A, 307B and 307C both may be doped with an impurity. The impurity may be, for example, phosphorus (P), arsenic (As), indium (In) or boron (B) ions. In some embodiments, the impurity may be an N-type impurity such as phosphorus (P) or arsenic (As). In some embodiments, impurity of a P-type impurity such as Boron (B) or indium (In). In some embodiments shown in FIG. 3A, the impurity is phosphorus (P). The gate threshold voltage decreases as the impurity concentration in the channel side increases. The gate threshold voltage increases as the impurity concentration in the channel side decreases. To obtain a lower gate threshold voltage, the impurity concentration in the channel side may be increased. However, as described earlier, to avoid undesirable short-channel effects, the amount to increase the impurity concentration in the channel side is limited.

Figures 3B, 3C:
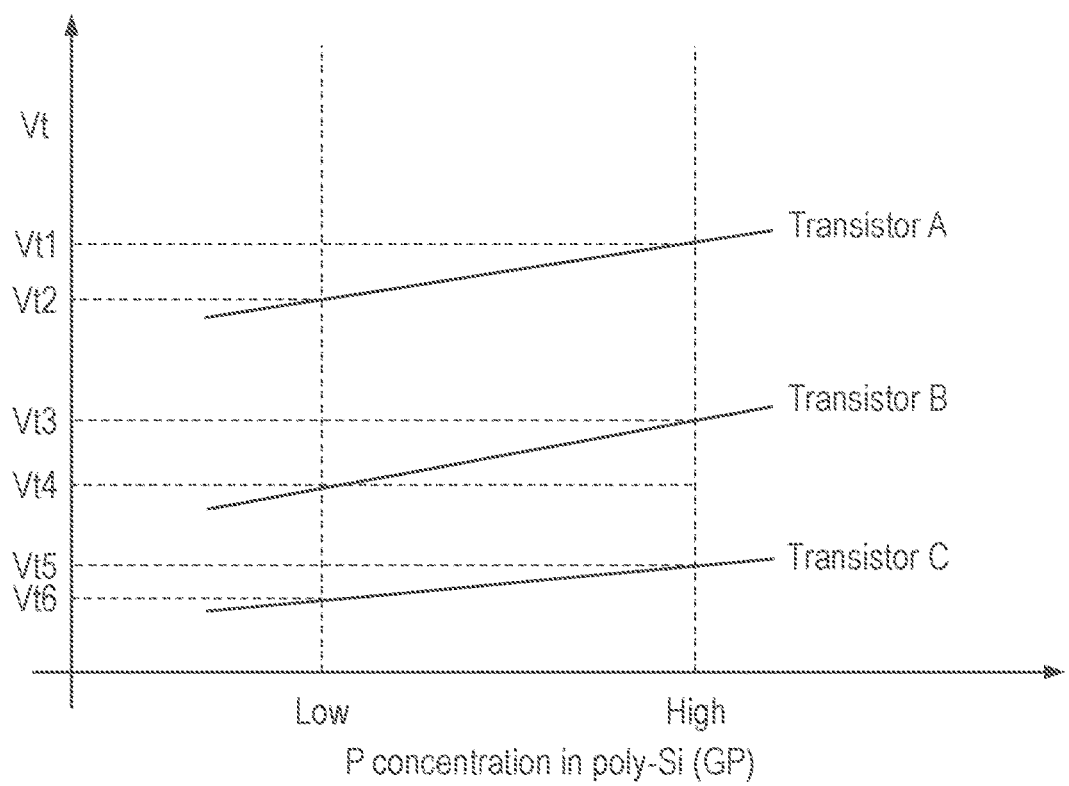
FIG. 3B is a table indicating a relationship between phosphorus concentrations in second gate electrode layers of gate electrodes of the plurality of transistors, channel side dopant implantation levels of the plurality of transistors and threshold voltages (Vts) of the plurality of transistors, in accordance with an embodiment of the present disclosure.
FIG. 3C is a schematic diagram indicating a relationship between phosphorus concentrations in second gate electrode layers of gate electrodes of the plurality of transistors, channel side dopant implantation levels of the plurality of transistors and threshold voltages (Vts) of the plurality of transistors, in accordance with an embodiment of the present disclosure.

In some embodiments, the gate threshold voltage may be controlled by adjusting impurity concentration in a gate electrode of each transistor. A higher impurity concentration in a second gate electrode layer (e.g., a poly-Si layer) of a gate electrode may increase a work function of an adjacent first gate electrode layer of the gate electrode. The increase of the work function of the first gate electrode layer of the gate electrode results in a higher threshold voltage of the gate electrode. A lower impurity concentration in a second gate electrode layer (e.g., a poly-Si layer) of a gate electrode may decrease a work function of an adjacent first gate electrode layer of the gate electrode. The decrease in the work function of the first gate electrode layer of the gate electrode results in a lower threshold voltage of the gate electrode. In FIG. 3A, the second gate electrode layers 306A, 306B and 306C may have different impurity concentrations from one another in some embodiments of the disclosure. FIG. 3B is a table indicating a relationship between phosphorus concentrations in second gate electrode layers (e.g., poly-Si layers) 306A, 306B and 306C of gate electrodes 31A, 31B and 31C of the plurality of transistors 30A, 30B and 30C and gate threshold voltages (Vt) of the plurality of transistors 30A, 30B and 30C, in accordance with an embodiment of the present disclosure. FIG. 3C is a schematic diagram indicating a relationship between phosphorus concentrations in second gate electrode layers (e.g., poly-Si layers) 306A, 306B and 306C of gate electrodes 31A, 31B and 31C of the plurality of transistors 30A, 30B and 30C, channel side dopant implantation levels of the plurality of transistors 30A, 30B and 30C and threshold voltages (Vts) of the plurality of transistors 30A, 30B and 30C, in accordance with an embodiment of the present disclosure.

In some embodiments, as the table of FIG. 3B shows, a channel side of the transistor 30A (Transistor A) below the gate insulator 304A has a relatively lower impurity concentration due to low impurity dose in either the channel region 303A or the LDD 307A. A channel side of the transistor 30B (Transistor B) below the gate insulator 304B has a middle impurity concentration due to middle impurity dose in either the channel region 303B or the LDD 307B. A channel side of the transistor 30C (Transistor C) below the gate insulator 304C has a relatively higher impurity concentration due to high impurity dose in either the channel region 303C or the LDD 307C. Due to the lower, middle, and higher impurity concentrations of the channel sides of the transistors 30A, 30B and 30C, the transistor 30B (Transistor B) may have a gate threshold voltage that is lower than the gate threshold voltage of the transistor 30A and higher than the gate threshold voltage of the transistor 30C when the impurity concentrations of the second gate electrode layers (poly-Si layers) 306A, 306B and 306C are the same.

As described earlier, a higher impurity concentration in a second gate electrode layer (a poly-Si layer) of a gate electrode may result in a higher threshold voltage of a transistor including the gate electrode. A lower impurity concentration in a second gate electrode layer (a poly-Si layer) of a gate electrode may result in a lower threshold voltage of the gate electrode. In the table of FIG. 3B, each second gate electrode layer of the second gate electrode layers 306A, 306B and 306C may have either high or low impurity concentration. For example, as shown in FIG. 3C, when the second gate electrode layer 306A has a high impurity concentration, the transistor 30A (Transistor A) may have a threshold voltage Vt1. When the second gate electrode layer 306A has a low impurity concentration, the transistor 30A (Transistor A) may have a threshold voltage Vt2 that is lower than the threshold voltage Vt1. Similarly, when the second gate electrode layer 306B has a high impurity concentration, the transistor 30B (Transistor B) may have a threshold voltage Vt3. When the second gate electrode layer 306B has a low impurity concentration, the transistor 30B (Transistor B) may have a threshold voltage Vt4 that is lower than the threshold voltage Vt3. Depending on whether the impurity concentration of the second gate electrode layer 306C is high or low, the transistor 30C (Transistor C) may have a higher threshold voltage Vt5 or a lower threshold voltage Vt6.

In some embodiments, if the impurity concentrations of the second gate electrode layers (poly-Si layers) 306A, 306B and 306C are low, a relationship between the gate threshold voltages Vt2, Vt4, and Vt6 of the transistors 30A, 30B and 30C may be expressed as an inequality, $Vt2>Vt4>Vt6$. In some embodiments, if the impurity concentrations of the second gate electrode layers (poly-Si layers) 306A, 306B and 306C are high, a relationship between the gate threshold voltages Vt1, Vt3, and Vt5 of the transistors 30A, 30B and 30C may be expressed as an inequality, $Vt1>Vt3>Vt5$. In some embodiments, as shown in FIGS. 3B and 3C, the transistor 30B may have a combination of the low impurity concentration of the second gate electrode layer 306B and the middle impurity concentration in the channel side (e.g., the channel region 303B and/or the LDD 307B) and the transistor 30C may have a combination of the high impurity concentration of the second gate electrode layer 306C and the high impurity concentration in the channel side (e.g., the channel region 303C and/or the LDD 307C). By adjusting the impurity concentration of the second gate electrode layers (poly-Si layers) 306B and 306C, the transistors 30B and 30C may even have similar threshold voltages Vt4 and Vt5 as shown in FIG. 3C. As described above, by combining the relationship of the impurity concentrations in the channel sides of the transistors 30A, 30B and 30C and the relationship of the impurity concentrations in the second gate electrode layers (poly-Si layers) 306A, 306B and 306C of the transistors 30A, 30B and 30C together, finer adjustment of threshold voltages of the transistors 30A, 30B and 30C may be performed.

The second gate electrode layers 306A, 306B and 306C with different impurity concentrations may be formed after impurity doping of the channel sides of the transistors 30A and 30B and 30C are completed and the gate insulators 304A, 304B and 304C are performed above the channel sides of the transistors 30A and 30B and 30. In some embodiments, the second gate electrode layers 306A, 306B and 306C may be formed, at least in part, in different steps using separate masks. For example, a poly-Si layer deposition with high doping of phosphorus can be performed to form at least a portion of the second gate electrode layers 306A, 306B and 306C. While performing the poly-Si layer deposition with high doping of phosphorus, an area including at least a portion of the second gate electrode layers 306A, 306B and 306C not selected for the poly-Si layer deposition with high doping of phosphorus may be masked. Another poly-Si layer deposition with low doping of phosphorus can be performed to form at least a portion of the second gate electrode layers 306A, 306B and 306C. While performing the poly-Si layer deposition with low doping of phosphorus, an area including a portion of the second gate electrode layers 306A, 306B and 306C not selected for the poly-Si layer deposition with low doping of phosphorus may be masked. Thus, these two poly-Si layer depositions of different levels of impurity doping may be performed separately on portions of the second gate electrode layers 306A, 306B and 306C. While not shown in FIGS. 3A, 3B and 3C, it may be possible to form a poly-Si layer deposition without doping of phosphorus for another portion of the second gate electrode layers 306A, 306B and 306C.

In some embodiments, the second gate electrode layers 306A, 306B and 306C may be formed in a same process by a poly-Si layer deposition followed by separate doping processes. The impurity, such as phosphorus, may be doped to provide different impurity concentrations as post-deposition steps. Thus, the second gate electrode layers 306A, 306B and 306C may have the different impurity concentrations from each other and have substantially the same thickness. Because of the same thickness, the same post-deposition processes may be performed for the gate electrodes 31A, 31B and 31C. Such post-deposition processes may include, for example, gate etching.

Either by poly-Si layer depositions with different impurity concentrations or post-deposition doping processes to provide different impurity concentrations, different impurity concentrations in the second gate electrode layers 306A, 306B and 306C can be formed. By forming the second gate electrode layers 306A, 306B and 306C with different impurity concentrations, the work functions of the first gate electrode layers 305A, 305B and 305C may be adjusted after the channel sides of the transistors 30A and 30B and 30C are formed and the gate insulators 306A, 306B and 306C are formed on the channel sides of the transistors 30A and 30B and 30C, therefore the impurity concentrations of the channel sides of the transistors 30A and 30B and 30C are fixed.

Even if the composition ratio between titanium (Ti) and nitrogen (N) is constant across the first gate electrode layers 305A, 305B and 305C, the work functions of the first gate electrode layers 305A, 305B and 305C included in the respective gate electrodes 31A, 31B and 31B may be adjusted differently because of a combination of the different impurity concentrations of the second gate electrode layers 306A, 306B and 306C and the different impurity concentrations of the channel sides of the transistors 30A, 30B and 30C (e.g., the channel regions 303A, 303B and 303C and/or the LDDs 307A, 307B and 307C). Because of the adjustment to the work functions of the first gate electrode layers 305A, 305B and 305C, the threshold voltages of the transistors 30A, 30B and 30C may be adjusted to have the same or different threshold voltages at or after the stage of the poly-Si layer depositions.

In the embodiments described above, DRAM is described as an example of the semiconductor devices 1, 2 and 3 according to various embodiments, but the above description is merely one example and not intended to be limited to DRAM. Memory devices other than DRAM, such as static random-access memory (SRAM), flash memory, erasable programmable read-only memory (EPROM), magnetoresistive random-access memory (MRAM), and phase-change memory for example can also be applied as the semiconductor device 1. Furthermore, devices other than memory, including logic ICs such as a microprocessor and an application-specific integrated circuit (ASIC) for example are also applicable as the semiconductor devices 1, 2 and 3 according to the foregoing embodiments.

Although various embodiments of the disclosure have been disclosed, it will be understood by those skilled in the art that the embodiments extend beyond the specifically disclosed embodiments to other alternative embodiments and/or uses and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed embodiments. Thus, it is intended that the scope of at least some of the present disclosure should not be limited by the particular disclosed embodiments described above.

What is claimed is:

1. A semiconductor device comprising:
   a semiconductor substrate; and
   first, second and third transistors, wherein each transistor of the first, second and third transistors comprises:
      a source region in the semiconductor substrate;
      a drain region in the semiconductor substrate;
      a gate insulator above the semiconductor substrate;
      a first gate electrode layer on the gate insulator; and
      a second gate electrode layer on the first gate electrode layer, and
   wherein the second gate electrode layers of the second and third transistors have impurity concentrations that are different from one another.

2. The semiconductor device of claim 1, wherein each transistor of the first, second and third transistors further comprises a channel side below the gate insulator of each transistor,
   wherein the channel sides of the first and second transistors have impurity concentrations that are different from one another.

3. The semiconductor device of claim 2, wherein each transistor of the first, second and third transistors further comprises a channel region between the source and drain regions of each transistor,
   wherein the channel regions of the first and second transistors have impurity concentrations that are different from one another.

4. The semiconductor device of claim 2, wherein each transistor of the first, second and third transistors further comprises a lightly doped drain (LDD) adjacent to the source and drain regions of each transistor,
   wherein the LDDs of the first and second transistors have impurity concentrations that are different from one another.

5. The semiconductor device of claim 1, wherein the first gate electrode layers of the first, second and third transistors comprise TiN, and wherein the first gate electrode layers of the first, second and third transistors have the same composition ratios of Ti and N in TiN.

6. The semiconductor device of claim 1, wherein the first, second and third transistors are N-channel MOSFETs.

7. A semiconductor device comprising:
   a semiconductor substrate; and
   first and second gate electrodes above the semiconductor substrate, each gate electrode of the first and second gate electrodes comprising:

a gate insulator above the semiconductor substrate;

a first gate electrode layer on the gate insulator; and a second gate electrode layer on the first gate electrode layer, wherein the second gate electrode layers of the first and second gate electrodes have impurity concentrations that are different from one another.

8. The semiconductor device of claim 7, further comprising:

a first film having a first impurity concentration; and a second film having a second impurity concentration, wherein the first film includes the second gate electrode layer of the first gate electrode and the second film includes the second gate electrode layer of the second gate electrode.

9. The semiconductor device of claim 7, wherein the second gate electrode layers of the first and second gate electrodes are formed in a same process step and wherein the second gate electrode layers of the first and second gate electrodes are doped with impurity to have different impurity concentrations after the same process step.

10. The semiconductor device of claim 7, wherein the second gate electrode layers of the first and second gate electrodes comprise phosphorus.

11. The semiconductor device of claim 7, wherein the gate insulators of the first and second gate electrodes comprise a High-k material.

12. The semiconductor device of claim 7, wherein the first gate electrode layers of the first and second gate electrodes have respective work functions that are different from one another.

13. The semiconductor device of claim 12, wherein the first gate electrode layers of the first and second gate electrodes comprise titanium nitride (TiN).

14. The semiconductor device of claim 13, wherein the first gate electrode layer of the first gate electrode has a composition ratio of titanium (Ti) and nitrogen (N) in TiN that is equal to a composition ratio of Ti and N in TiN included in the first gate electrode layer of the second gate electrode.

15. A semiconductor device comprising:

a semiconductor substrate;

an isolation region; and first, second and third transistors isolated from each other by the isolation region, wherein each transistor of the first, second and third transistors comprises:

a gate insulator above the semiconductor substrate;

a first gate electrode layer on the gate insulator; and a second gate electrode layer on the first gate electrode layer, and wherein the second gate electrode layer of the third transistor has an impurity concentration different from impurity concentrations of the second electrode layers of the first and second transistors.

16. The semiconductor device of claim 15, wherein the second gate electrode layer of the third transistor has the impurity concentration that is lower than the impurity concentrations of the second electrode layers of the first and second transistors.

17. The semiconductor device of claim 15, wherein the first gate electrode layers of the second and third transistors are formed in a same process step, and wherein the first gate electrode layers of the first and second transistors are formed in different process steps.

18. The semiconductor device of claim 17, wherein the first gate electrode layer of the first transistor has a chemical composition different from chemical compositions of the first gate electrode layers of the second and third transistors.

19. The semiconductor device of claim 17, wherein the first gate electrode layers of the first, second and third transistors have a same chemical composition, and wherein the first transistor has a composition ratio of the chemical composition different from chemical composition ratios of the first gate electrode layers of the second and third transistors.

20. The semiconductor device of claim 17, wherein the first transistor is a P-channel metal-oxide-semiconductor field-effect transistor (MOSFET), and the second and third transistors are N-channel MOSFETs.

* * * * *

UNITED STATES PATENT AND TRADEMARK OFFICE
CERTIFICATE OF CORRECTION

PATENT NO. : 11,527,536 B2
APPLICATION NO. : 17/143923
DATED : December 13, 2022
INVENTOR(S) : Mika Yoshida et al.

It is certified that error appears in the above-identified patent and that said Letters Patent is hereby corrected as shown below:

On the Title Page

Item (72) Inventors Information:
Mika Yoshida, Hiroshima (JP)
Yoshikazu Moriwaki, Hiroshima (JP)

Should Be:
Mika Yoshida, Higashihiroshima Hiroshima (JP)
Yoshikazu Moriwaki, Higashihiroshima, Hiroshima (JP)

Signed and Sealed this
Seventh Day of March, 2023

Katherine Kelly Vidal
*Director of the United States Patent and Trademark Office*